(12) United States Patent
Lowrey et al.

(10) Patent No.: US 6,545,907 B1
(45) Date of Patent: Apr. 8, 2003

(54) TECHNIQUE AND APPARATUS FOR PERFORMING WRITE OPERATIONS TO A PHASE CHANGE MATERIAL MEMORY DEVICE

(75) Inventors: Tyler A. Lowrey, San Jose, CA (US); Ward D. Parkinson, Boise, ID (US); Manzur Gill, Cupertino, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/021,469

(22) Filed: Oct. 30, 2001

(51) Int. Cl.[7] ............................................... G11C 11/00
(52) U.S. Cl. .................... 365/163; 365/189.01
(58) Field of Search ......................... 365/163, 189.01, 365/189.04, 220, 230.04, 233

(56) References Cited

U.S. PATENT DOCUMENTS 5,625,824 A * 4/1997 Melo et al. .................. 365/222
6,247,073 B1 * 6/2001 Takeda ........................ 375/359
6,373,747 B1 * 4/2002 Harari et al. ........... 365/185.03

* cited by examiner

Primary Examiner—Michael S. Lebentritt
Assistant Examiner—Anh Phung
(74) Attorney, Agent, or Firm—Trop, Pruner & Hu, P.C.

(57) ABSTRACT

A technique includes, in response to a request to write data to memory cells of a phase change memory device, placing the memory cells in a state that is shared in common among the memory cells. Also, in response to this request, the data is written to the memory cells.

40 Claims, 7 Drawing Sheets

TECHNIQUE AND APPARATUS FOR PERFORMING WRITE OPERATIONS TO A PHASE CHANGE MATERIAL MEMORY DEVICE

BACKGROUND

This invention generally relates to electronic memories, and more particularly, the invention relates to a technique and apparatus for performing write operations to a phase change material memory device.

A phase change material may be used to store the memory state for a memory cell of a semiconductor memory device. In this manner, phase change materials that are used in phase change material memory devices may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized to exhibit these two states. However, as an example, thin-film chalcogenide alloy materials may be particularly suitable.

The phase change may be induced reversibly. Therefore, the phase change material may change from the amorphous to the crystalline state and may revert back to the amorphous state thereafter, or vice versa, in response to temperature changes. In effect, when the phase change material is used in a memory cell, the memory cell may be thought of as a programmable resistor, which reversibly changes between higher and lower resistance states. The phase change may be induced by resistive heating that is caused by a current that flows through the material.

The memory cell of a phase change memory device is not limited to just two memory states (i.e., a "1" state and a "0" state), but instead the memory cell may have a large number of states. That is, because each state may be distinguished by its resistance, a number of resistance determined states may be possible, allowing the storage of multiple bits of data in a single memory cell.

A variety of phase change alloys are known. Generally, chalcogenide alloys contain one or more elements from Column VI of the periodic table. One particularly suitable group of alloys is the GeSbTe alloys.

A potential difficulty with the use of a phase change material as a memory storage device is that the time needed to change from the crystalline state to the amorphous state may be significantly shorter than the time needed to change from the amorphous state to the crystalline state. In this manner, FIG. 1 depicts temperature profiles that cause a particular phase change material to change states. In particular, FIG. 1 depicts a crystallizing set pulse 20 that generally extends from about time $T_0$ to time $T_2$ to place the phase change material in the crystalline state. As shown, the set pulse 20 represents a momentary rise in the temperature of the phase change material. The set pulse 20 is to be contrasted to the reset pulse 10, a pulse that is also associated with a higher temperature of the phase change material but has a significantly shorter duration, as the reset pulse 10 extends from about time $T_0$ to $T_1$. Thus, the reset pulse 10 may be used to transform a phase change material-based memory cell from the crystalline state to the amorphous state, or "reset" the state of the memory cell to "0." In contrast, the set pulse 20 may be used to set the state of the memory cell to "1."

Due to the discrepancy in the time needed to set the phase change material-based memory cell versus the time needed to reset the cell, the write set cycle time (i.e., the time allocated to force the state of the cell to indicate a set bit, or a "1") maybe ten to two hundred times longer than the write reset cycle time (i.e., the time allocated to force the state of the cell to indicate a reset bit, or a "0").

A conventional approach for a memory device that exhibits such a discrepancy in time between different types of write cycles is to set the time allocated for a given write cycle to the time needed to perform the slowest possible write cycle. Thus, the slowest write cycle may effectively establish the write cycle speed of the memory device.

A conventional way to accommodate a slow memory device is to either use a high speed static random access memory (SRAM) cache or shift registers to buffer a high data rate burst. Alternatively, several slow speed memories may be mounted in parallel such that alternative pieces of data may be put into the data latch of the first memory, the next piece of data stored in the latch of the second memory, etc. However, a potential difficulty with these approaches is that a large number of memory chips may be required, and thus, there is a greater associated cost per bit.

Thus, there is a continuing need for a technique and/or arrangement to address one or more of the problems that are stated above.

DETAILED DESCRIPTION

Figure 1:
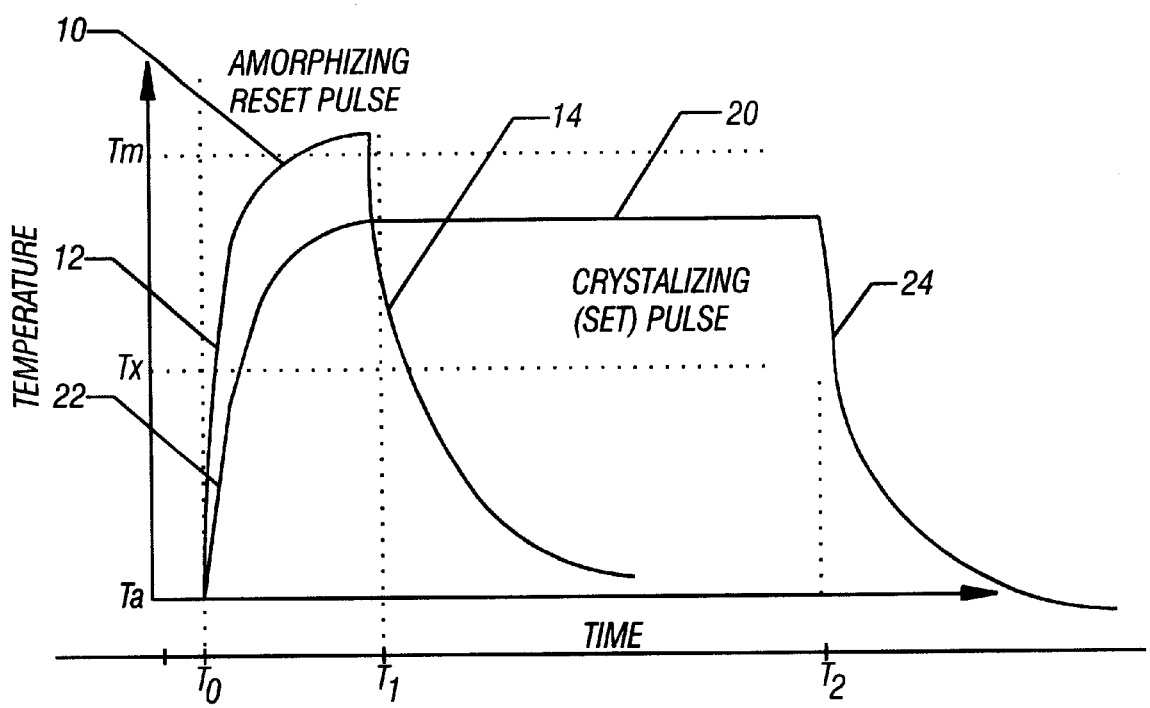
FIG. 1 depicts temperature waveforms for setting and resetting a memory cell of a phase change material memory device of the prior art.
Figure 2:
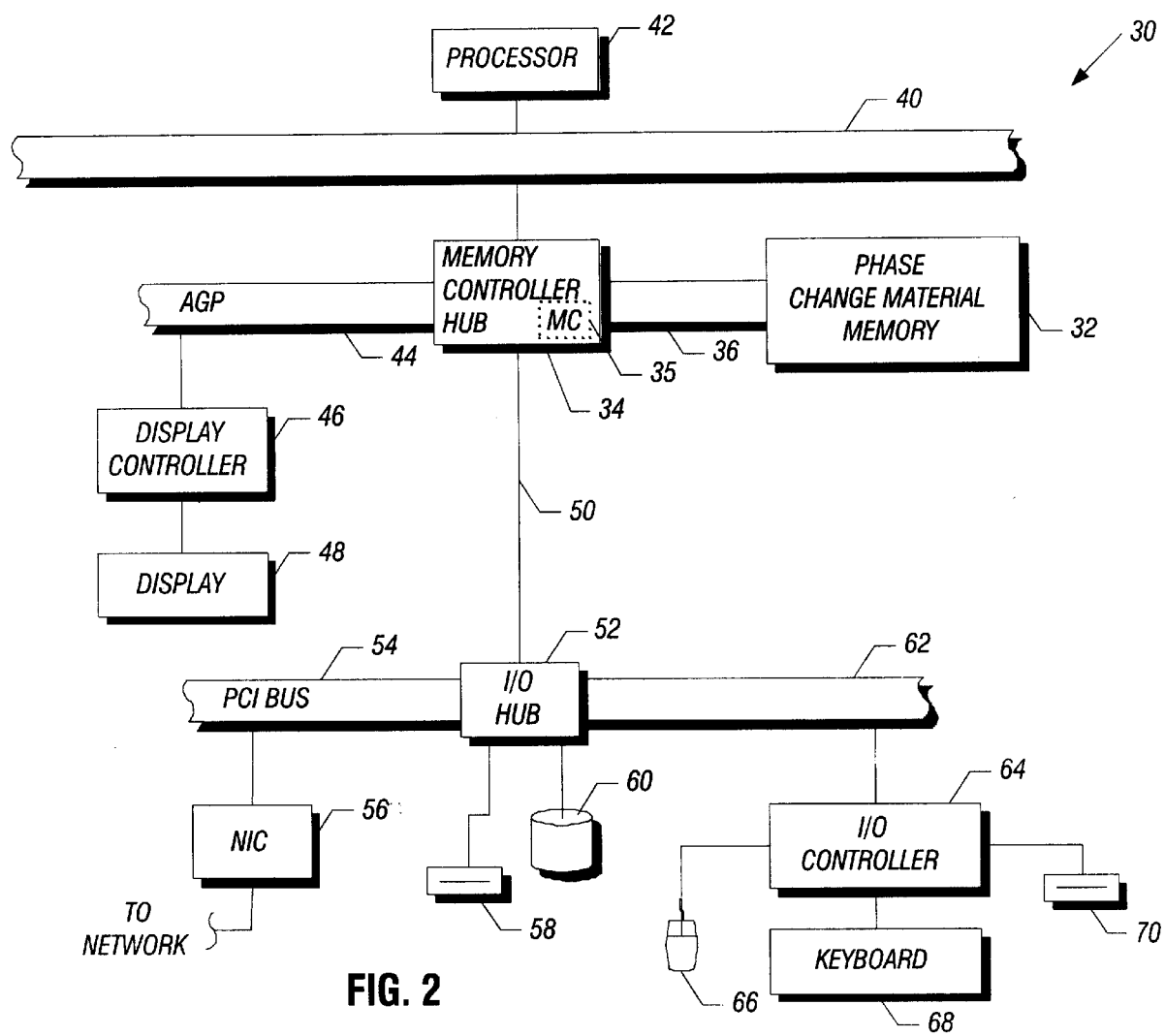
FIG. 2 is a schematic diagram of a computer system according to an embodiment of the invention.

Referring to FIG. 2, an embodiment 30 of a computer system in accordance with the invention includes a phase change material memory 32 that communicates with a memory controller hub 34 via a memory bus 36. As an example, in some embodiments of the invention, the phase change material memory 32 may include various memory devices (semiconductor memory chips, or packages, for example), each of which includes phase change material-based memory cells. As an example, each memory cell of a particular memory device may include a phase change material (a thin-film chalcogenide alloy material, for example) that exhibits crystalline and amorphous states. These states, in turn, are used to indicate the data states ("1" and "0" states, for example) of the memory cell.

The memory bus 36 includes communication lines for communicating data to and from the memory 32 as well as control and address lines for controlling the storage and retrieval of data to and from the memory 32. A particular write or read operation may involve concurrently writing data to or reading data from several devices of memory 32.

In general, the time to set a bit of the memory 32 is significantly longer than the time to reset the bit of the memory 32. To take advantage of the shorter reset time, a write operation in accordance with the invention may be performed pursuant to a technique 100 that is depicted in FIG. 3.

Figure 3:
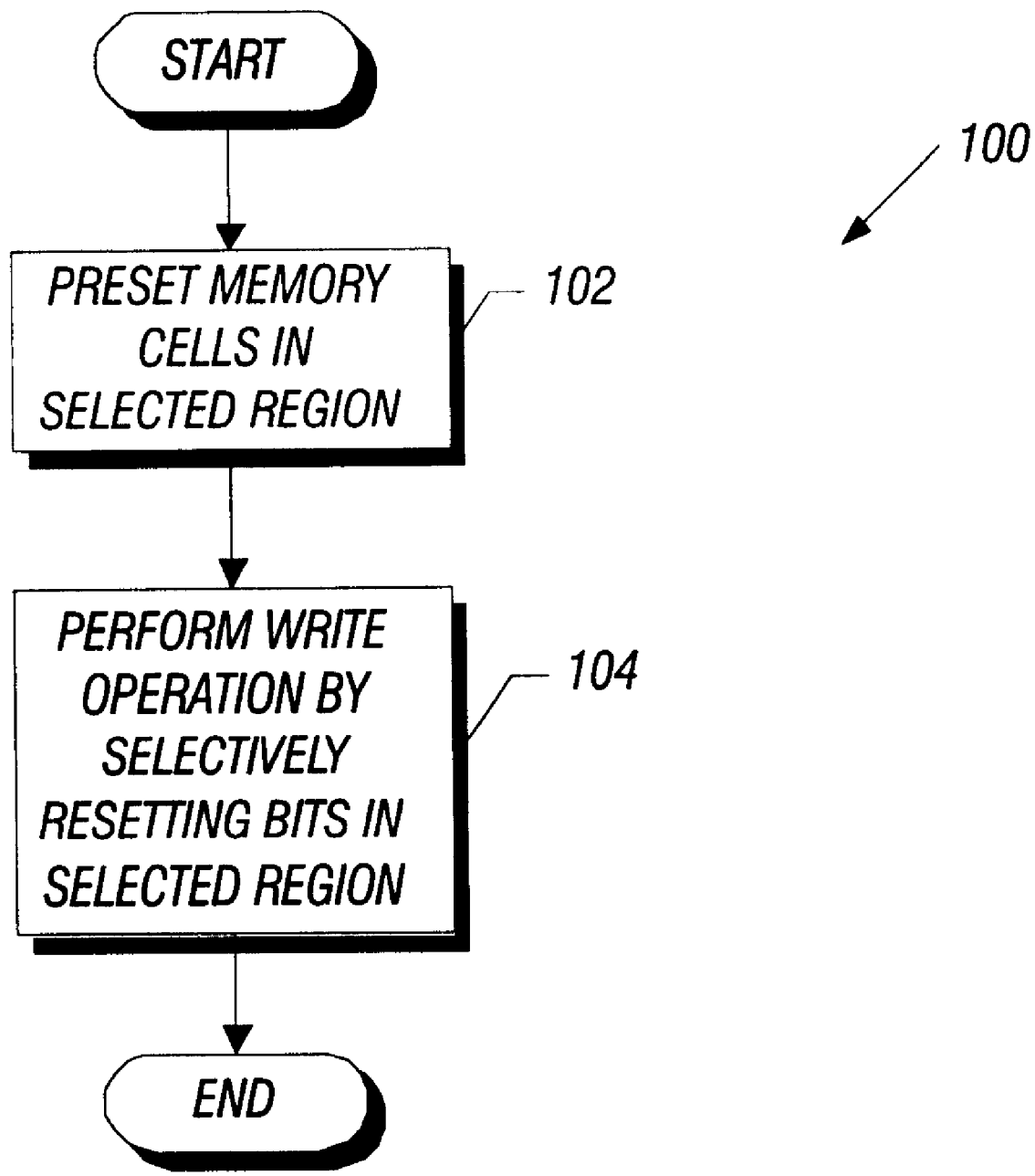
FIG. 3 is a flow diagram depicting a technique for a block write operation to a phase change material memory device according to an embodiment of the invention.

Referring both to FIGS. 2 and 3, in accordance with the technique 100, to write a data to a targeted, or selected, region of the memory 32 (in a burst write operation, as an example), the memory controller hub 34 furnishes the appropriate signals to the memory bus 36 to preset the memory cells in the selected region, as depicted in block 102. Although the presetting of a particular memory cell in the phase change material memory 32 is, in general, relatively slow as compared to the resetting of the memory cell, the targeted memory cells may be preset by one or more block write cycles. Thus, by presetting a region (a block, for example) of multiple memory cells, the preset time per memory cell is relatively small due.

After the entire selected region has been preset, advantage may then be taken of the shorter time needed to reset a particular phase change material-based memory cell. In this manner, the write operation to the selected region of the memory 32 continues by selectively resetting (block 104) bits of the selected region. In this manner, in resetting the bits of the region, the memory cells that are associated with the "0" bits of write data are reset (via write preset cycles), while the memory cells that are associated with the "1" bits of the data are masked from the write operation, as these memory cells have been preset.

Figure 4:
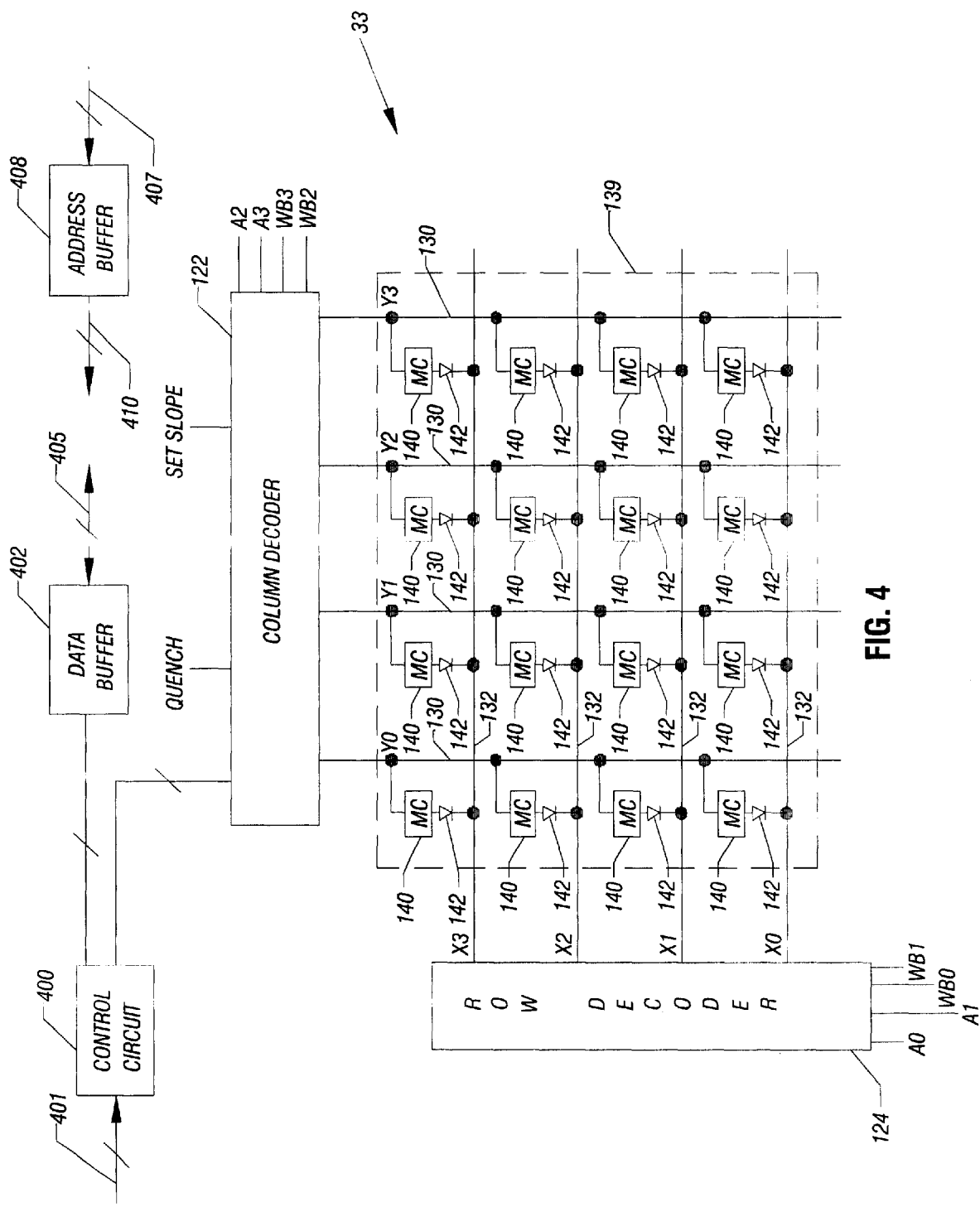
FIG. 4 is a schematic diagram of a phase change material memory device according to an embodiment of the invention.

FIG. 4 depicts a particular memory device 33 of the memory 32 in accordance with some embodiments of the invention. The specific structure of the memory device 33 is depicted for purposes of describing at least one out of many possible embodiments of the invention. It is understood that other and different structures may be used, as the scope of the invention is defined by the appended claims.

The memory device 33 includes memory cells 140 that are addressed via column lines 130 and row lines 132, as can be appreciated by those skilled in the art. Each memory cell 140 includes a phase change material whose state is controlled by write preset/set cycles to store an associated bit of data.

Although a 4×4 block 139 of the memory cells 140 is depicted in FIG. 4, it is understood that this array size is used to simplify the proceeding discussion. Thus, the memory device 33 may have a significantly larger array of memory cells 140.

As can be seen from FIG. 4, each memory cell 140 is associated with a particular column line 130 and a particular row line 132, and the activation of the associated column 130 and row 132 lines selects the cell 140. In this manner, the memory cell 140 may be coupled to its associated column line 130 and may be coupled through what is effectively a diode 142 (a PNP bipolar junction transistor (BJT), for example) to its associated row line 132. Therefore, when a particular memory cell 140 is selected, its associated column line 130 is driven high and its associated row line 132 is driven low, a condition that causes a current pulse to flow through the memory cell 140. It is the magnitude and duration of this current pulse that determines whether the memory cell 140 is being read, set (via a write set pulse) or reset (via a write reset pulse).

In response to address signals (called A0, A1, WB0 and WB1), the row decoder 124 selects one or more row lines 132, corresponding to the selection of one, two or four row lines 132. In this manner, the row decoder 124, in response to these address signals, selectively drives row select signals (called X0, X1, X2 and X3) low to select one or more of the row lines 132. As an example, a certain combination of the address signals may cause the row decoder 124 to select two of the row lines, another combination of the address signals may cause the row decoder 124 to select one of the row lines 132, another combination of the address signals may cause the row decoder 124 to select four of the row lines 132, etc. When the row decoder 124 drives the row line(s) 132 low, this enables a read or write cycle to occur to one or more memory cells 140, depending on the selections by the column decoder 122.

The column decoder 122, in response to its received address selection signals (called A2, A3, WB3 and WB2) drives column select signals (called Y0, Y1, Y2 and Y3) high to select one or more column lines 130. In this manner, when one of the column select signals is driven high, the corresponding column line 130 has been selected. Similar to the row decoder 124, the column decoder 122 may select one, two or four column lines 130. Thus, the selection of the column line(s) by the column decoder 122 and the row line(s) 132 by the row decoder 124 addresses selected memory cells 140 and may be used to address a block of the memory cells 140.

For purposes of controlling the time profiles currents that are used to set and reset the selected memory cells 140, the column decoder 122 receives signals called QUENCH and SET_SLOPE. The SET_SLOPE signal establishes a slope in the current/temperature profile that is used to set particular memory cells(s). In this manner, when the SET_SLOPE signal is asserted (driven high, for example) during a write set cycle, the column decoder 122 imparts a trailing edge on the set pulse, as described further below. Conversely when the set SLOPE signal is de-asserted (driven low, for example) during a write reset cycle, the column decoder 122 does not add this trailing edge.

The QUENCH signal is used to control the time at which the set or reset pulse ends. In this manner, in response to the QUENCH signal being asserted (driven high, for example), the column decoder 122 ends the current reset/set pulses. Conversely, in response to the QUENCH signal being deasserted, the column decoder 122 allows the current reset or set pulses (if occurring) to continue. Thus, the QUENCH signal may be used to end the slope established by the SET_SLOPE signal during a write set cycle.

Figure 5:
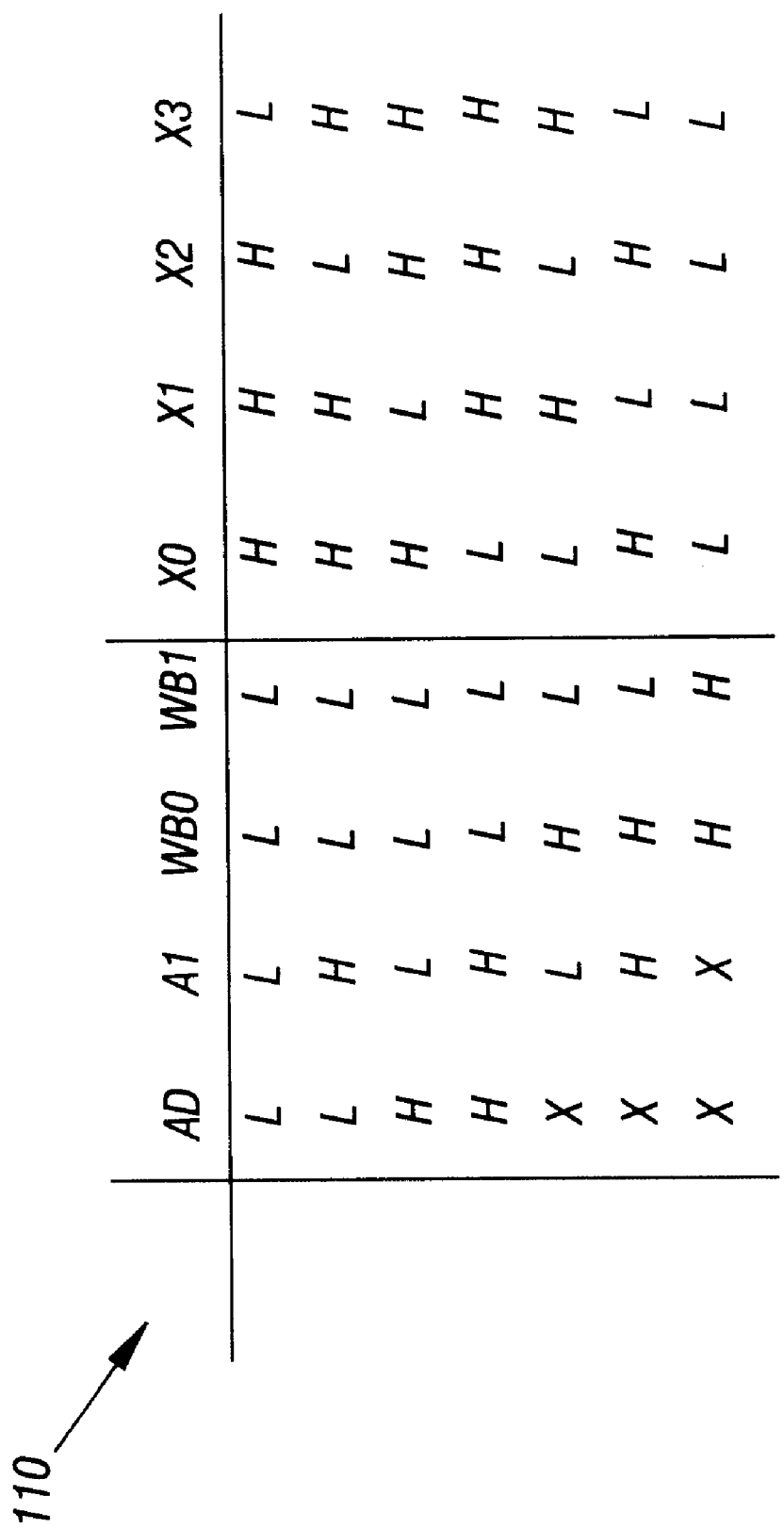
FIG. 5 is a truth table associated with a row decoder of the phase change material memory device of FIG. 4 according to an embodiment of the invention.

The address signals that are received by the row 124 and column 122 decoders may be used in a variety of different ways to select the memory cells 140. As an example of at least one possible embodiment, FIG. 5 depicts a truth table 110 that illustrates the selection of the row select signals X0, X1, X2 and X3 in response to various states for the address decode signals A0, A1, WB0 and WB1. As shown, when all of the address signals are driven low (indicated by the "L" state), then the row decoder 120 drives only the X3 row select signal to select one corresponding row line 132. Other individual row lines 132 maybe selected by combinations of the A0 and A1 signals, as depicted in rows 1–4 of the truth table 110. For these selections by the A0 and A1 signals, it is noted that the WB0 and WB1 signals are driven low. Rows 5 and 6 of the truth table 110 depict combinations possible when the WB0 signal is driven high and the WB1 signal is driven low. As shown, for these states, two row lines 132 are selected, and the two particular row lines that are selected depend on the state of the A1 signal. When both the WB0 and WB1 signals are driven high, then all of the row lines 132 are selected, as depicted in line 7 of the truth table 110. Other combinations may be used to select the rows 132.

Figure 6:
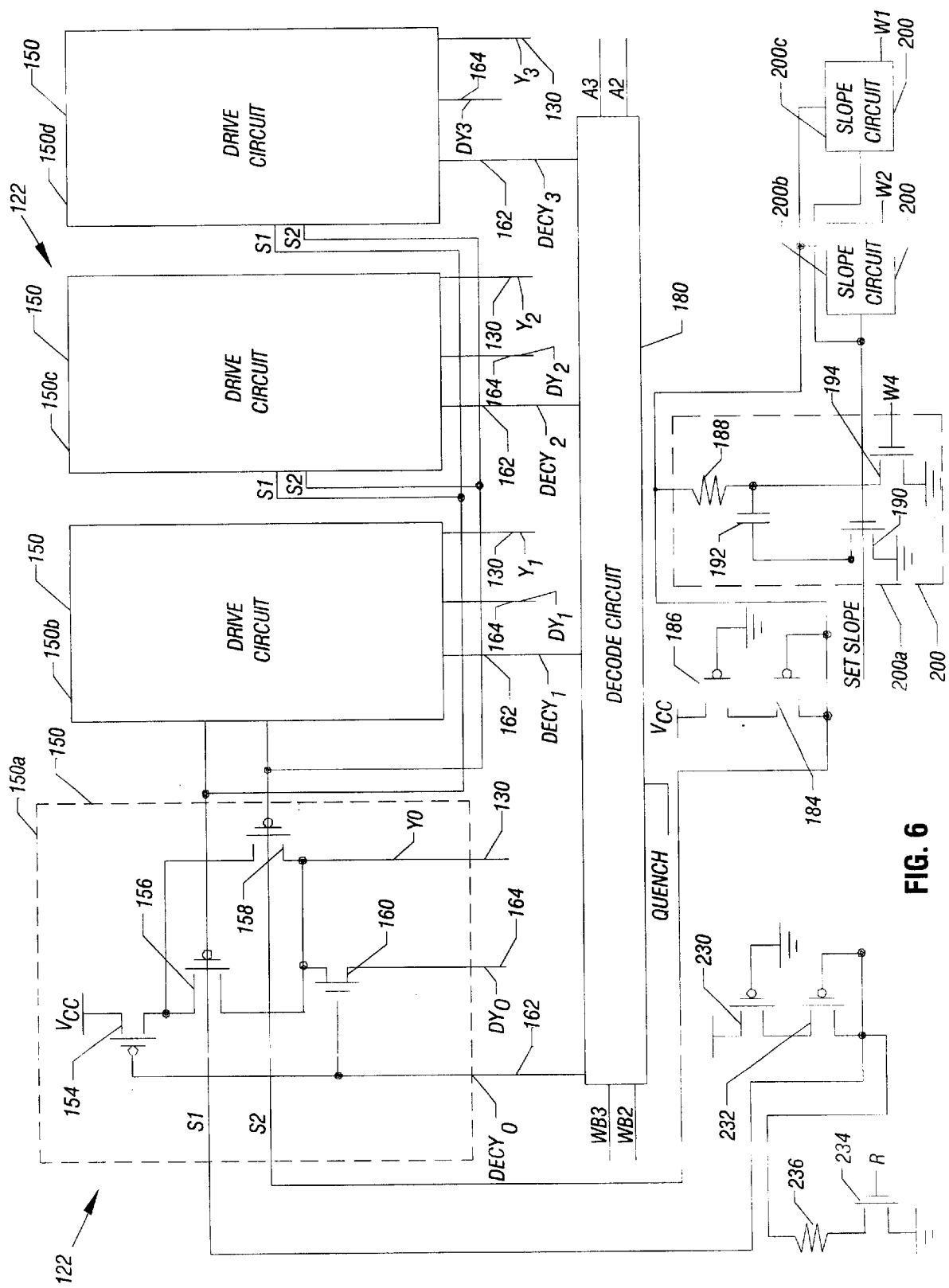
FIG. 6 is a schematic diagram of a column decoder of the phase change material memory device of FIG. 4 according to an embodiment of the invention.

FIG. 6 depicts one out of many possible embodiments for the column decoder 122. In this manner, in some embodiments of the invention, the column decoder 122 includes drive circuits 150 (drive circuits 150a, 150b, 150c and 150d, as examples), each of which is associated with a different column line 130. A particular drive circuit 150 is activated for purposes of selecting and reading/writing data from one or more cells 140 of its associated column line 130 in response to a signal that is provided by a decode circuit 180. More particularly, the decode circuit 180 receives the column address signals A2, A3, WB2 and WB3 and furnishes decode signals called DECY0, DECY1, DECY2 and DECY3 that are used to activate the decode circuits 150a, 150b, 150c and 150d, respectively. As an example, the drive circuit 150a is activated in response to the assertion of the DECY0 signal by the decode circuit 180.

In some embodiments of the invention, the drive circuit 150 may have the circuitry that is illustrated in FIG. 6 for the drive circuit 150a. In particular, the drive circuit 150 may include a P-channel metal-oxide-semiconductor field-effect-transistor (PMOSFET) 154 that has its source terminal coupled to a positive voltage supply (called VCC) and its drain terminal coupled to the source terminal of a PMOSFET 158. The drain terminal of the PMOSFET 158, in turn, is coupled to the column line 130 that is associated with the drive circuit 150.

The gate terminal of the PMOSFET 154 receives the corresponding decode signal (DECY0, DECY1, DECY2 or DECY3) from the decode circuit 180. As an example, for the drive circuit 150a, the gate terminal of the PMOSFET 154 receives the DECY0 signal. When this signal is asserted (driven high, for example) the drain-source path of the PMOSFET 154 conducts a current that, in a write cycle, is established by the PMOSFET 158. In this manner, the gate terminal of the PMOSFET 158 receives a current sense signal (called S2) that establishes the current through the drain-source path of the PMOSFET 154, the drain-source path of the PMOSFET 158 and the current that flows into the associated column line 130. Thus, the drain-source paths of the PMOSFETs 154 and 158 are serially coupled together with the column line 130.

As described below, depending on the number of memory cells that are selected along a particular column line 130, the column decoder 122 adjusts the magnitude of the S2 signal so that each activated drive circuit 150 provides more current to its associated column line 130 when two memory cells 140 per selected column line 130 are being written than when one memory cell 140 per selected column line 130 is being written. Furthermore, in response to the selection of four memory cells 140 per column line 130, the column decoder 122 adjusts the magnitude of the S2 signal so that more current is applied to the selected column line 130 than when one memory cell per selected column line 130 is being written.

For a read cycle, the drive circuit 150 includes a PMOSFET 156. The source terminal of PMOSFET 156 is coupled to the drain terminal of the PMOSFET 154, and the drain terminal of the PMOSFET 156 is coupled to the column line 130 that is associated with the drive circuit 150. The gate terminal of PMOSFET 156 receives a current sense called S1. In this manner, similar to the S2 signal, the column decoder 122 adjusts the magnitude of the S1 signal to adjust the level of current that flows through the associated column line 130 during a read operation, as the drain-path of the PMOSFET 156 is coupled in series with the drain-source path of the PMOSFET 154 in the column line 130.

Although an example of a detailed schematic diagram for the drive circuit 150a is depicted in FIG. 6, the other drive circuits 150b, 150c and 150d may have similar designs, in some embodiments of the invention. Other designs are possible for the drive circuit 150, in other embodiments of the invention.

To generate and control the S2 signal, in some embodiments of the invention, the column decoder 122 includes the following circuitry. This circuitry includes a PMOSFET 186 that has its gate terminal coupled to ground. The source terminal of the PMOSFET 186 is coupled to a positive supply voltage (called VCC), and the drain terminal of the PMOSFET 186 is coupled to the source terminal of a PMOSFET 184. The gate and drain terminals of the PMOSFET 184 are coupled together to furnish the S2 signal. These terminals are also coupled to one terminal of a resistor 188. The other terminal of the resistor 188 is coupled to the drain terminal of an N-channel MOSFET (NMOSFET) 194 that has its source terminal coupled to ground. The gate terminal of the NMOSFET 194 receives a signal called W4.

Thus, due to this arrangement, when the W4 signal is asserted, the NMOSFET 194 conducts, as determined by the resistance of the resister 188, a current that flows through the PMOSFETs 184 and 186. This current, in turn establishes the level of the S2 signal that, in turn, establishes the current that flows through the selected column lines 130.

The resistor 188 and the NMOSFET 194 are part of a slope circuit 200. In this manner, in some embodiments of the invention, the column decoder 122 includes three such slope circuits 200a, 200b and 200c. The differences between the slope circuits are established by the value of the resistance 188 and the signal received at the gate terminal of the NMOSFET 194. In this manner, the slope circuit 200b receives a signal called W2, and the slope circuit 200c receives a signal called W1. When only one memory cell 140 is to be written per selected column line 130, only the W1 signal is asserted, and as a result, the slope circuit 200c is used to set the current through the column line 130. However, if two memory cells 140 are to be written per selected column line 130, then both the W1 and W2 signals are asserted (driven high, for example) to cause twice the level of current to flow than when one memory cell 140 per column line 130 is written through the select column line 130. If four memory cells 140 per column are to be written, then the W1, W2, and W4 signals are all asserted (driven high, for example) to cause additional current to flow through the selected column lines 130. The resistances of the resistors 188 in each of the slope circuits 200 have the appropriate values to implement the necessary binary weighting of the current among the slope circuits 200.

For purposes of establishing the trailing edge of the set pulse, in some embodiments of the invention, each slope circuit 200 includes a MOSFET 190 and a capacitor 192. In this manner, the gate terminal of the MOSFET 190 receives the SET_SLOPE signal, and the source terminal of the MOSFET 190 is coupled to ground. The drain terminal of the MOSFET 190 is coupled to one terminal of a capacitor 192, and the other terminal of the capacitor 192 is coupled to the drain terminal of the MOSFET 194.

Due to this arrangement, when a write set cycle is performed, the SET_SLOPE signal is asserted to cause both terminals of the capacitor 192 to be coupled to ground.

Therefore, when the MOSFET 194 de-activated, the capacitor 192 introduces a time constant to produce the trailing edge of the set pulse. The end of the set pulse may be controlled via the assertion of the QUENCH signal.

Referring back to FIG. 4, among the other features of the memory device 33, the memory device 33 may include a control circuit 400 to generate signals to control such cycles in the memory device 33 as the read cycles, write preset cycles and write reset cycles. The control circuit 400 receives signals (via input lines 401) from the memory bus 36 indicative of potential addresses and commands that involve the memory device 33. In this manner, the control circuit 300 may decode a burst write operation and generate the appropriate signals to control the storage of data associated with the burst write operation in targeted memory cells 140 of the memory device 33. The memory device 33 may also include additional circuitry, such as, for example, a data buffer 402 to temporarily store the data flowing into and out of the memory device 33 and communicates data to the memory bus 36 via data communication lines 405. The memory device 33 may also include an address buffer 408 that communicates with the memory bus via communication lines 407. The address buffer 408 shares the addresses associated with memory operations as well as decodes the addresses and to some extent may generate the address signals (on the communication lines 410) that are provided to the row 124 and column 122 decoders.

Referring back to FIG. 2, in some embodiments of the invention, the computer system 30 may include other components than the memory controller hub 34 and the memory 32. In particular, in some embodiments of the invention, the computer system 30 may include a processor 42 (one or more microprocessors or controllers, as examples) that is coupled to a system bus 40. The system bus 40, in turn is coupled to the memory controller hub 34 along with an Accelerated Graphics Port (AGP) bus 44. The AGP is described in detail in the Accelerated Graphics Port Interface Specification, Revision 1.0, published on Jul. 31, 1996, by Intel Corporation of Santa Clara, Calif.

The computer system 30 may also include a display controller 46 that is coupled to the AGP bus 44 and generates signals to drive a display 48. The memory controller hub 34 is also coupled (via a hub interface 50) to an input/output (I/O) hub 52. The I/O hub 52 may provide interfaces to, for example a Peripheral Component Interconnect (PCI) bus 54 and an expansion bus 62. The PCI Specification is available from The PCI Special Interest Group, Portland, Oreg. 97214. The PCI bus 54 may be coupled to a network interface card (NIC) 56, and the I/O controller 64 may receive input from a mouse 66, and the I/O controller 64 may receive input from a mouse 66 and a keyboard 68, as well as control operation of a floppy disk drive 70. The I/O hub 52 may also control operation of a CD-ROM drive 58 and control operation of a hard disk drive 60.

In some embodiments of the invention, the memory controller hub 34 may include a memory controller 35. In this manner, the memory controller 35 serves as an interface between the memory bus 36 and the PCI 54, system 40 and AGP 44 buses. The memory controller 35 generates signals to indicate the control signals, address signals and data signals that are associated with a particular write or read operation that targets cells of the phase change material memory 32.

Figure 7:
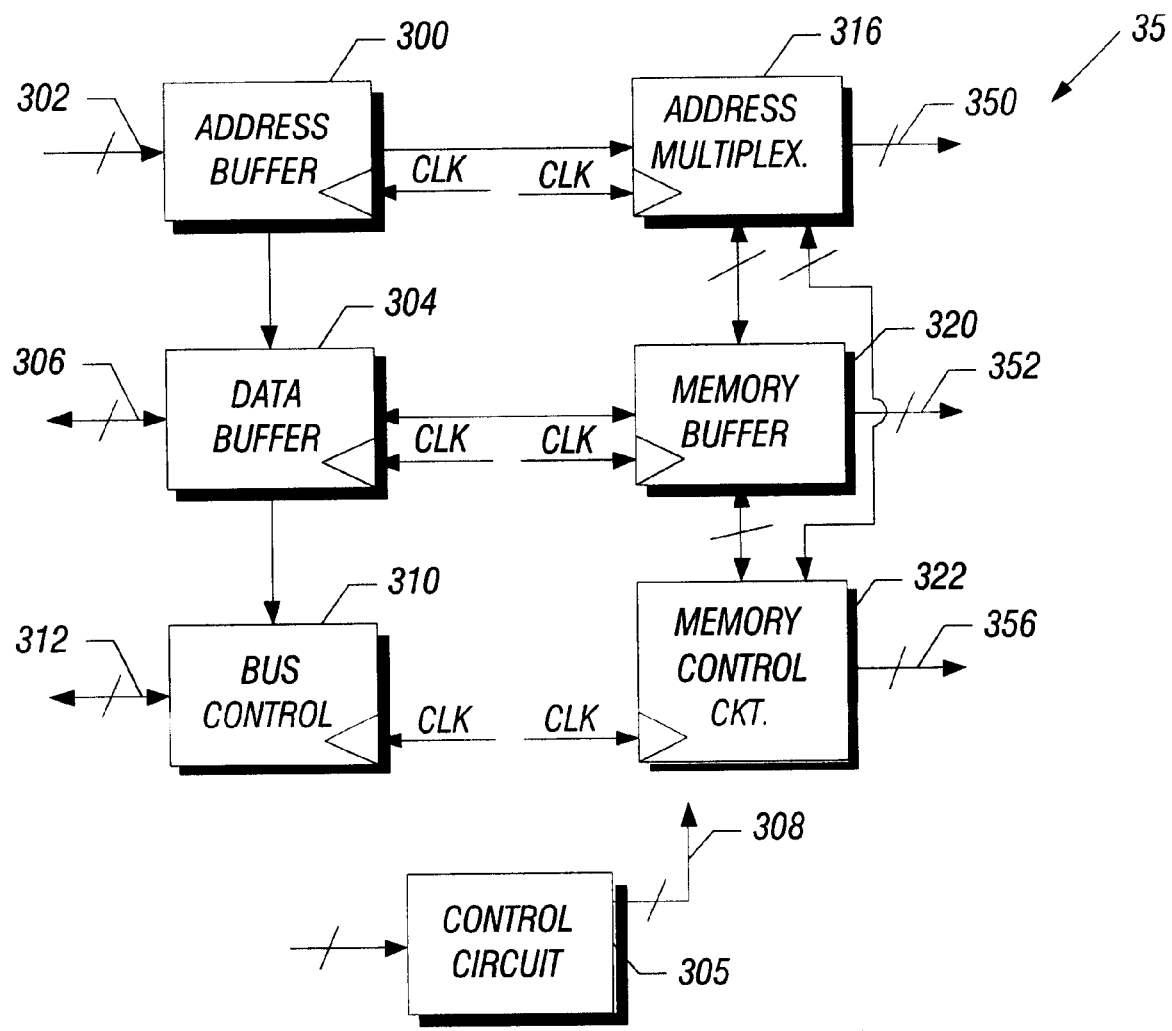
FIG. 7 is a schematic diagram of a memory controller of the computer system of FIG. 2 according to an embodiment of the invention.

Referring to FIG. 7, in some embodiments of the invention, the memory controller 35 includes an address buffer 300 that receives (via address lines 302) address signals that indicate an address for an associated write or read request, a data buffer 304 that receives (via data lines 306) signals that are indicative of data to be written to/read from the memory 32, and a bus control circuit 310 that receives (via control lines 312) signals indicative of the operation to be performed with the memory. Although the memory controller 35 may perform both write and read operations with the memory 32, the block write operation is discussed below.

The memory controller 35 includes an address multiplexer 316 that receives a signal indicative of an address from the address buffer 300 targeting the next region of the memory 32 to which a write operation is to be performed. The memory controller 35 also includes a memory buffer 320 that receives data (from the data buffer) that is associated with a subsequent write operation to be performed to the memory 32. A control circuit 305 of the memory controller 35 coordinates the operation of the memory controller 35 via its control lines 308.

It is noted that the address multiplexer 316 furnishes signals on its output lines 350 indicative of the address for a particular write operation, and the memory buffer 320 generates signals on its output lines 352 indicative of data to be written to the memory 32 in a particular write operation.

The memory controller 35 performs a write operation to the memory 32 in response to a write request. The write request for a particular block write operation may be received by the memory controller 35 or may alternatively be generated by the memory controller 35 itself. In this manner, the memory controller 35 may queue unconnected write operations until the memory controller 35 gathers data that targets a contiguous region of the memory 32. In this manner, when the block of write data is accumulated, the memory controller 35 has effectively initiated its own write request.

With the above-described hardware, there are numerous ways to perform the technique 100. For example, in some embodiments of the invention, each memory device 33 may perform the technique 100 in a manner that is transparent outside of the memory device 33. In this manner, memory cells 140 of the memory device 33 may be the target of a write operation, such as a burst write operation, for example. In response to receiving the write command (via the memory bus 36), the memory device 33 presets the targeted memory cells 140 via a block write preset cycle and then subsequently selectively resets the targeted memory cells 140 via write reset cycles.

In another variation, the presetting of a block of memory cells 140 may be accomplished through the execution of software instructions by the processor 42. In this manner, the processor 42 may generate a write request that is communicated to the memory controller 35 for purposes of writing a block of ones to a targeted region of the memory 42. Subsequently, the processor 42 generates a write request that is communicated to the memory controller 35 for purposes of writing the data to be stored in the targeted region. In this manner, in some embodiments of the invention, the memory devices 33 that are involved in the write operation may mask off the memory cells 140 that are associated with "1" bits from being written in this subsequent write operation.

In yet another variation, the memory controller 35 may perform the technique 100 by, in response to a write request, first generating signals on the memory bus 36 to initiate a write operation to the memory 32 to write a block of "1" bits to a targeted region of the memory 42. Next, the memory controller 35 generates signals on the memory bus 36 to initiate a memory operation to the memory 32 to write the data to be stored in the targeted region. In this manner, the memory devices 33 that are involved in the write operation may mask off the memory cells 140 that are associated with "1" bits from being written.

The memory controller 35 initiates the preset and set write cycles in the memory 32 in accordance with the technique 100. In this manner, to write a block of data to a targeted region of the memory 32, the memory controller 35 first writes a block of ones to the targeted region. Next, the memory controller 35 may mask off bytes associated with all ones and generates the appropriate write requests to store the block of data in the targeted region. The masking of the one bits may also be performed by each memory device 33.

Other arrangements are possible. For example, the phase change material memory 32 and the associated circuitry to control operation of the memory 32 may be used in systems other than the computer system 30. For example, the above-described circuitry may be used in a cellular telephone, personal assistant, or other devices, as just a few examples.

In some embodiments of the invention, the write reset cycle is performed with an optimum current that is a function of the Chalcogenide target used for depositing it, pore size, and height. If a DVD style target is used with a small pore size under 0.2 $\mu$m×0.2 $\mu$m, the required current for reset may be about 3 ma, for example. As an example, in some embodiments of the invention, the reset pulse is applied with a rapid leading edge under 2 nsec, about 10 nsec of width, and a fast trailing edge of under 2 nsec.

In some embodiments of the invention, the write set cycle uses a current of more like 2 ma with fast leading and trailing edges, such as a 3 ma current (like the reset current), a fast leading edge under 2 nsec, and a slow trailing edge between 250 nanoseconds (nsec) and preferably 2 microseconds ($\mu$s) to assure optimum writing for various material imperfections that may occur.

If a slow trailing edge on the set pulse is used to set the device (set slope method), then the current for set may be equal to reset. However, a peak current for set that is 10% less, and maybe even 30% less will work equally well for set, even if the reset current is at the minimum that will work. Reset is preferably set at the minimum reset current plus at least 30%. Usually the reset level is at least 30% more than that required for set. Hence, good margin is maintained if the set peak current is equal to Reset or 30% less. The design is preferably done with peak set current equal to peak reset current. The reset height is about 3 ma and at least 30% greater than typical minimums, width is 10 nsec, with a rising edge reasonably fast, say 2–5 nsec, and a trailing edge well less than 10 nsec and preferably less than 5 nsec. Set preferably has a rising edge like reset, a peak current preferably equal to but at least within 30% of reset, with a trailing edge 3 times greater than the slope required to write with set current equal to reset current, preferably 1 usec for good margin.

Other embodiments are within the scope of the following claims. For example, the technique described herein may be used not just for a high speed burst of a block, but also for presetting a set of words, line, or any sub-block. Also, the technique that is described herein may preferably be extended to sequential sets of bursts (which also may be for less than a block). When a sequential bursts are predictably loaded into blocks or sub-blocks within the memory, the next block or sub-block to be written can be pre-set while the current burst of data is being loaded. For example in a camera, when frames of video are to be sequentially loaded in blocks 1–60 for a video sequence, block 1 can be preset to the set state, and the burst of data loaded into block 1. While block 1 is loading, block 2 can be preset to the set state so it is ready to load when block 1 is complete. Then, while block 2 is loading, block 3 can be preset. The presetting of block N+1 during loading of block N can be extended by one skilled in the art to involve parallel preset of more than one block at once at appropriate times and for appropriate utilization—at reduced risk of premature overlaying a section of memory. By doing presetting in advance, even greater bandwidth may be achieved since a memory need not pause during preset before being loaded. If the pre-set is already complete, continuous loading at the high reset write time per bit(s) can be done, avoiding the "down time" of presetting. Further, by pre-setting in parallel with loading, fewer simultaneous bits per cycle may be preset, reducing the magnitude of the current pulse and need for decoupling transients. This technique of presetting the next block while loading this block may be done automatically or under user explicit command control, a decision that may be controlled by a user input to the memory.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
   in response to a request to write data to memory cells of a phase change memory device, placing the memory cells in a state shared in common among the memory cells; and
   in response to the request, writing the data to the memory cells.

2. The method of claim 1, wherein the placing comprises: presetting the memory cells.

3. The method of claim 1, wherein the writing comprises: selectively resetting the memory cells.

4. The method of claim 1, wherein the writing comprises: writing to the cells that correspond to bits of the data associated with another state different from the first state.

5. The method of claim 1, wherein the placing comprises: performing a block write cycle.

6. The method of claim 1, wherein the writing comprises: masking off the cells that correspond to bits of the data associated with the same state as the first state in the writing.

7. The method of claim 1, wherein the writing is performed after the placing.

8. The method of claim 1, wherein the state shared in common comprises a preset state.

9. The method of claim 1, wherein the placing comprises: placing each memory cell in a crystalline state.

10. The method of claim 1, wherein the writing comprises:
    selectively placing certain memory cells in an amorphous state.

11. A memory controller comprising:
    a first circuit to receive data associated with a request to write data to a group of at least one memory cell of a phase change memory device; and
    a second circuit to:

in response to the request, place each memory cell in the group in a state shared in common among said at least one memory cell of the group, and in response to the request, perform a write operation to the phase change memory device to cause said at least one memory cell to indicate the data.

12. The memory controller of claim 11, wherein the second circuit, in response to a request, presets each memory cell of the group.

13. The memory controller of claim 11, wherein the second circuit performs the write operation by selectively resetting certain memory cells of the group in response to the data.

14. The memory controller of claim 11, wherein the second circuit performs the write operation by writing to the cells that correspond to bits of the data associated with another state different from the first state.

15. The memory controller of claim 11, wherein the second circuit performs a block write operation to cause said at least one memory cell to indicate the data.

16. The memory controller of claim 15, wherein the second circuit masks off the cells that corresponds to bits of the data associated with the same state as the first state in the block write operation.

17. The memory controller of claim 11, wherein the second circuit performs a block write operation in response to the request to place each memory cell in the group in the state shared in common.

18. The memory controller of claim 11, wherein the state shared in common comprises a preset state.

19. The memory controller of claim 11, wherein the state comprises a crystalline state.

20. The memory controller of claim 11, wherein the second circuit performs the write operation by selectively placing certain memory cells of the group in an amorphous state.

21. A computer system comprising:

a phase change memory; and a memory controller to:
receive data associated with a request to write data to a group of at least one memory cell of the phase change memory device,
in response to the request, place each memory cell in the group in a state shared in common among said at least one memory cell of the group, and
in response to the request, perform a write operation to the phase change memory device to cause said at least one memory cell to indicate the data.

22. The computer system of claim 21, wherein the memory controller presets each memory cell of the group to place each memory cell in the group in the state shared in common.

23. The computer system of claim 21, wherein the memory controller performs the write operation by selectively resetting the memory cell of the group in response to the data.

24. The computer system of claim 21, wherein the memory controller performs the write operation by writing to the cells that correspond to bits of the data associated with another state different from the first state.

25. The computer system of claim 21, wherein the memory controller performs the write operation by writing to a block of the memory cells.

26. The computer system of claim 25, wherein the memory controller masks off the cells that correspond to bits of the data associated with the same state as the first state in the block write operation.

27. The computer system of claim 21, wherein the memory controller places each memory cell in the group in the state shared in common by performing a block write operation.

28. The computer system of claim 21, wherein the state shared in common comprises a preset state.

29. The computer system of claim 21, wherein the memory controller places each memory cell in the group in the state shared in common by placing each memory cell in a crystalline state.

30. The computer system of claim 21, wherein the memory controller performs the write operation to the phase change memory device by selectively placing certain memory cells of the group in an amorphous state.

31. A memory device comprising:

an array of phase change material-based memory cells;

a first circuit to receive data associated with a request to write data to a group of the memory cells; and a second circuit to:
in response to the request, place each memory cell in the group in a state shared in common among the memory cells of the group, and
in response to the request, write the data to the phase change memory device.

32. The memory device of claim 31, wherein the second circuit, in response to the request, presets each memory cell of the group.

33. The memory device of claim 31, wherein the second circuit selectively resets certain memory cells of the group in response to the request.

34. The memory device of claim 31, wherein the second circuit writes to the cells that correspond to bits of the data associated with another state different from the first state.

35. The memory device of claim 31, wherein the state shared in common comprises a preset state.

36. A computer system comprising:

a memory controller to provide signals indicative of a write operation; and a phase change memory to:
in response to the signals, place each memory cell in a group of cells targeted by the write operation in a state shared in common among the memory cells of the group, and
perform at least one write cycle to cause the memory cells of the group to indicate the data.

37. The computer system of claim 36, wherein the memory presets each memory cell of the group to place each memory cell in the group in the state shared in common.

38. The computer system of claim 36, wherein the memory selectively resets the memory cells in said at least one write cycle.

39. The computer system of claim 36, wherein the memory performs writes to the cells of the group that correspond to bits of the data associated with another state different from the first state.

40. The computer system of claim 36, wherein the state shared in common comprises a preset state.

* * * * *